(12) United States Patent
Hoentschel et al.

(10) Patent No.: US 8,975,704 B2
(45) Date of Patent: Mar. 10, 2015

(54) MIDDLE IN-SITU DOPED SIGE JUNCTIONS FOR PMOS DEVICES ON 28 NM LOW POWER/HIGH PERFORMANCE TECHNOLOGIES USING A SILICON OXIDE ENCAPSULATION, EARLY HALO AND EXTENSION IMPLANTATIONS

(71) Applicant: GLOBALFOUNDRIES Singapore Pte. Ltd., Singapore (SG)

(72) Inventors: Jan Hoentschel, Dresden (DE); Shiang Yang Ong, Dresden (DE); Stefan Flachowsky, Dresden (DE); Thilo Scheiper, Dresden (DE)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/196,517

(22) Filed: Mar. 4, 2014

(65) Prior Publication Data

US 2014/0183654 A1    Jul. 3, 2014

Related U.S. Application Data

(62) Division of application No. 13/482,410, filed on May 29, 2012, now Pat. No. 8,703,578.

(51) Int. Cl.
*H01L 21/70* (2006.01)
*H01L 27/092* (2006.01)
*H01L 29/66* (2006.01)
(Continued)

(52) U.S. Cl.
CPC ............ *H01L 27/092* (2013.01); *H01L 29/665* (2013.01); *H01L 29/6656* (2013.01); *H01L 29/6659* (2013.01); *H01L 29/66636* (2013.01); *H01L 29/7833* (2013.01); *H01L 29/7834* (2013.01); *H01L 29/7848* (2013.01); *H01L 29/0847* (2013.01); *H01L 29/1054* (2013.01); *H01L 29/165* (2013.01); *H01L 21/823807* (2013.01); *H01L 21/823814* (2013.01); *H01L 21/823864* (2013.01); *H01L 27/0883* (2013.01); *H01L 29/4966* (2013.01);
(Continued)

(58) Field of Classification Search
CPC ............... H01L 27/088; H01L 21/8238; H01L 29/6656
USPC .................. 257/E21.618, 192, 368, E29.255, 257/E21.626, E27.06, E21.409, E21.632; 438/231
See application file for complete search history.

(56) References Cited

U.S. PATENT DOCUMENTS 4,702,792 A    10/1987  Chow et al.
2002/0045360 A1*  4/2002  Murakami et al. ............ 438/786
(Continued)

*Primary Examiner* — Kyoung Lee
*Assistant Examiner* — Ratisha Mehta
(74) *Attorney, Agent, or Firm* — Ditthavong & Steiner, P.C.

(57) ABSTRACT

A HKMG device with PMOS eSiGe source/drain regions is provided. Embodiments include forming first and second HKMG gate stacks on a substrate, each including a $SiO_2$ cap, forming extension regions at opposite sides of the first HKMG gate stack, forming a nitride liner and oxide spacers on each side of HKMG gate stack; forming a hardmask over the second HKMG gate stack; forming eSiGe at opposite sides of the first HKMG gate stack, removing the hardmask, forming a conformal liner and nitride spacers on the oxide spacers of each of the first and second HKMG gate stacks, and forming deep source/drain regions at opposite sides of the second HKMG gate stack.

20 Claims, 8 Drawing Sheets

(51) Int. Cl.
- *H01L 29/78* (2006.01)
- *H01L 29/08* (2006.01)
- *H01L 29/10* (2006.01)
- *H01L 29/165* (2006.01)
- *H01L 21/8238* (2006.01)
- *H01L 27/088* (2006.01)
- *H01L 29/49* (2006.01)
- *H01L 29/51* (2006.01)

(52) U.S. Cl.
CPC ............ *H01L 29/517* (2013.01); *H01L 29/518* (2013.01); *H01L 29/1083* (2013.01)
USPC ............ 257/368; 257/192; 257/E21.168; 257/E29.255; 257/E21.626; 257/E27.06; 257/E21.409; 257/E21.632; 257/E21.618; 438/231

(56) References Cited

U.S. PATENT DOCUMENTS

| | | |
|---|---|---|
| 2010/0032715 A1 | 2/2010 | Cheng et al. |
| 2010/0038727 A1* | 2/2010 | Chakravarthi et al. ........ 257/408 |
| 2010/0187636 A1* | 7/2010 | Yang et al. .................... 257/369 |
| 2010/0210083 A1 | 8/2010 | Fukuda et al. |
| 2010/0224938 A1* | 9/2010 | Zhu ............................... 257/369 |

* cited by examiner

MIDDLE IN-SITU DOPED SIGE JUNCTIONS FOR PMOS DEVICES ON 28 NM LOW POWER/HIGH PERFORMANCE TECHNOLOGIES USING A SILICON OXIDE ENCAPSULATION, EARLY HALO AND EXTENSION IMPLANTATIONS

CROSS-REFERENCED APPLICATION

This application is a division of U.S. application Ser. No. 13/482,410 filed May 29, 2012, the entirety of which is incorporated herein by reference.

TECHNICAL FIELD

The present disclosure relates to semiconductor device with embedded silicon germanium (SiGe) source/drain regions. The present disclosure is particularly applicable to gate first high-k metal gate (HKMG) devices for 28 nanometer (nm) technologies.

BACKGROUND

In modern CMOS technologies, embedded SiGe source/drain areas are standard in PFET devices as they improve performance by introducing uniaxial strain into the channel. Embedded SiGe integration occurs in early processes primarily for silicon-on-insulator (SOI) substrates and in late processes for bulk silicon substrates, with both HKMG gate first and last technologies. The integration of embedded SiGe, especially on the 28 nm technologies is performed early in the fabrication process, to maximize the amount of strain transferred into the channel and, therefore, improve performance.

HKMG gate last technologies generally use boron doped late SiGe, whereas HKMG gate first processes, especially for 32 nm and 28 nm technologies, form the gate first to obtain maximum performance of the device with an undoped non-sigma shaped cavity. With this type of integration, several problems occur. For example, encapsulation of the gate first HKMG and, therefore, yield issues arise, process complexity increases as additional steps are required, such as formation of sacrificial oxide spacers and differential disposable spacers, and removal of a dry nitride cap, which processes are costly.

A need therefore exists for methodology enabling fabrication of a low power high performance PMOS device with embedded SiGe source/drain regions and encapsulation of a gate first HKMG electrode, and the resulting device.

SUMMARY

An aspect of the present disclosure is method of forming a HKMG CMOS device with embedded SiGe (eSiGe) in the PMOS, by encapsulating the PMOS metal gate and masking the NMOS with a hardmask during eSiGe formation.

Another aspect of the present disclosure is a HKMG CMOS device with embedded SiGe in the PMOS.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second HKMG gate stacks on a substrate, each HKMG gate stack including a silicon dioxide ($SiO_2$) cap; forming extension regions at opposite sides of the first HKMG gate stack; forming a nitride liner and oxide spacers on each side of each of the first and second HKMG gate stacks; forming a hardmask over the second HKMG gate stack; forming eSiGe at opposite sides of the first HKMG gate stack; removing the hardmask; forming a conformal liner and nitride spacers on the oxide spacers of each of the first and second HKMG gate stacks; and forming deep source/drain regions at opposite sides of the second HKMG gate stack.

Aspects of the present disclosure include forming the nitride liner of silicon nitride (SiN), the oxide spacers of $SiO_2$, and the nitride spacers of SiN. Other aspects include the first and second HKMG gate stacks each further including a high-k dielectric, a work function metal, and polysilicon (poly-Si). Another aspect includes precleaning prior to forming the eSiGe; and optimizing the precleaning to protect the $SiO_2$ spacers and $SiO_2$ cap. Further aspects include forming eSiGe at each side of the first HKMG gate stack by: forming a cavity in the substrate by wet etching with tetramethylammonium hydroxide (TMAH); and epitaxially growing SiGe in the cavity. Additional aspects include implanting a boron dopant in-situ into the eSiGe, for example with a graded doping profile. Other aspects include forming a halo region at opposite sides of the first HKMG gate stack directly after forming the hardmask or directly after forming the cavities and forming a halo and an extension region at opposite sides of the second HKMG gate stack directly after forming the oxide spacers or directly after removing the hardmask. Additional aspects include annealing to activate implanted dopants. Another aspect includes removing the $SiO_2$ cap after annealing. A further aspect includes forming a silicide on the source/drain regions, the eSiGe, and the first and second HKMG gate stacks. Other aspects include removing the hardmask by wet etching with phosphoric acid ($H_3PO_4$) or by dry etching. Another aspect includes forming a channel SiGe region below the first HKMG gate stack.

Another aspect of the present disclosure is a device including: first and second HKMG gate stacks, each comprising a high-k dielectric, a work function metal, and poly-Si; a nitride liner, oxide spacers, a conformal liner, and nitride spacers successively formed on each side of each of the first and second HKMG gate stacks; extension regions at opposite sides of the first HKMG gate stack formed prior to the nitride liner; eSiGe at opposite sides of the first HKMG gate stack, formed prior to the conformal liner using a hardmask over the second gate stack; and deep source/drain regions at opposite sides of the second gate HKMG gate stack, formed using the nitride spacers as a soft mask.

Aspects include the nitride liner including SiN and the oxide spacers including silicon dioxide ($SiO_2$). Further aspects include the eSiGe being doped in-situ with boron having a graded doping profile. Other aspects include halo regions at opposite sides of the first HKMG gate stack, formed directly prior to the eSiGe; and halo and extension regions at opposite sides of the second HKMG gate stack formed directly after the oxide spacers. Additional aspects include a silicide on the eSiGe, the deep source/drain regions, and the first and second HKMG gate stacks.

Another aspect of the present disclosure includes a method including: forming PMOS and NMOS HKMG gate stacks on a substrate, each HKMG gate stack including an $SiO_2$ cap; forming extension regions at opposite sides of the PMOS HKMG gate stack; forming an L-shaped SiN liner and $SiO_2$ spacers on each side of each of the PMOS and NMOS HKMG gate stacks; forming a halo and an extension region at opposite sides of the NMOS HKMG gate stack; forming a hardmask over the NMOS HKMG gate stack; forming a halo region at opposite sides of the PMOS HKMG gate stack; precleaning and optimizing the precleaning to protect the $SiO_2$ spacers and $SiO_2$ cap; forming eSiGe at opposite sides of the PMOS HKMG gate stack by: forming a cavity in the substrate at each side of the PMOS HKMG gate stack by wet etching with TMAH; epitaxially growing SiGe in the cavity; and implanting a boron dopant, with a graded doping profile, in-situ into the eSiGe concurrently with the epitaxial growth; removing the hardmask by wet etching with phosphoric acid ($H_3PO_4$) or by dry etching; forming an L-shaped conformal liner and SiN spacers on the oxide spacers of each of the PMOS and NMOS HKMG gate stacks; implanting deep source/drain regions at opposite sides of the NMOS HKMG gate stack; annealing to activate implanted dopants; removing the $SiO_2$ cap after annealing; and forming a silicide on the source/drain regions, the eSiGe, and the PMOS and NMOS HKMG gate stacks.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
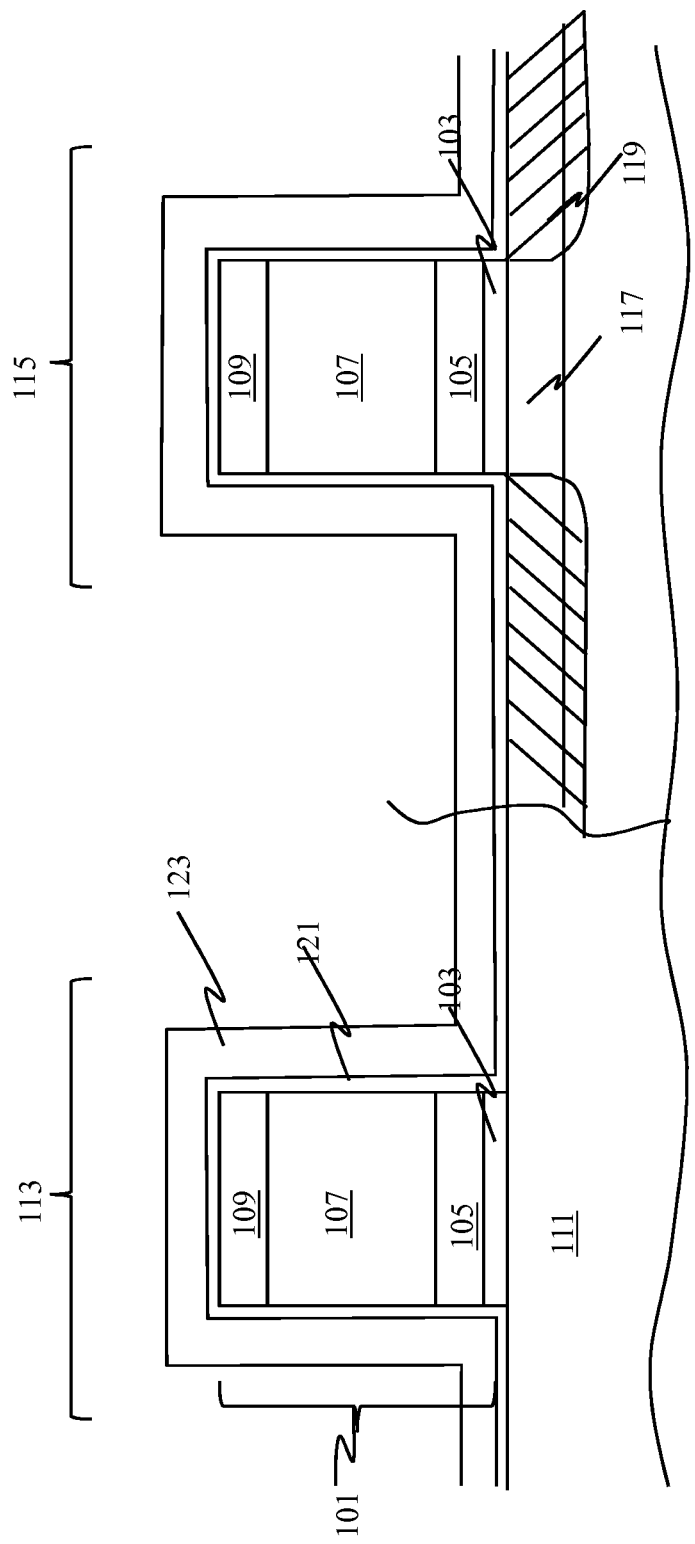
FIGS. 1A through 1H schematically illustrate a process flow for forming a semiconductor device with PMOS embedded SiGe source/drain regions, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of insufficient encapsulation of the gate first HKMG, attendant upon forming eSiGe source/drain regions in undoped non-sigma shaped cavities for PMOS devices, which in turn reduces yield and increases complexity. In accordance with embodiments of the present disclosure, a nitride liner and oxide spacers are formed on each side of the gate stack to protect the metal gate, and a hardmask is formed over the NMOS gate stack during the SiGe epitaxy.

Methodology in accordance with embodiments of the present disclosure includes forming first and second HKMG gate stacks on a substrate, each HKMG gate stack including a $SiO_2$ cap, forming extension regions at opposite sides of the first HKMG gate stack, forming a nitride liner and oxide spacers on each side of each of the first and second HKMG gate stacks, forming a hardmask over the second HKMG gate stack; forming eSiGe at opposite sides of the first HKMG gate stack, removing the hardmask, forming a conformal liner and nitride spacers on the oxide spacers of each of the first and second HKMG gate stacks, and forming deep source/drain regions at opposite sides of the second HKMG gate stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1H illustrate a process flow incorporating embedded SiGe in the PMOS, in accordance with an exemplary embodiment of the present disclosure. Adverting to FIG. 1A, a gate first HKMG stack 101, including high-k dielectric 103, for example hafnium oxide ($HfO_2$) or hafnium silicon oxynitride (HfSiON), work function metal 105, such as titanium nitride (TiN), poly-Si 107, and $SiO_2$ cap 109, is shown on silicon substrate 111 for each of NMOS 113 and PMOS 115. PMOS 115 further includes channel SiGe (cSiGe) 117 to a thickness of 5 to 10 nm into substrate 111, below high-k dielectric 103, to adjust the threshold voltage due to the gate first approach. After the gate etch, a masking step is implemented to open the PMOS and apply early extension implantation 119 for the PMOS. Using the gate first approach further requires an encapsulation layer around the gate stack to protect the HKMG from later process steps such as cleans and etches. For this purpose, a multilayer deposition (MLD) SiN layer 121 is blanket deposited over the entire substrate to a thickness of 3 nm to 6 nm. An $SiO_2$ layer 123 is formed over SiN MLD layer 121 to a thickness of 6 nm to 11 nm, for forming a spacer zero on each side of each gate stack, as illustrate in FIG. 1B.

Figure 1B:
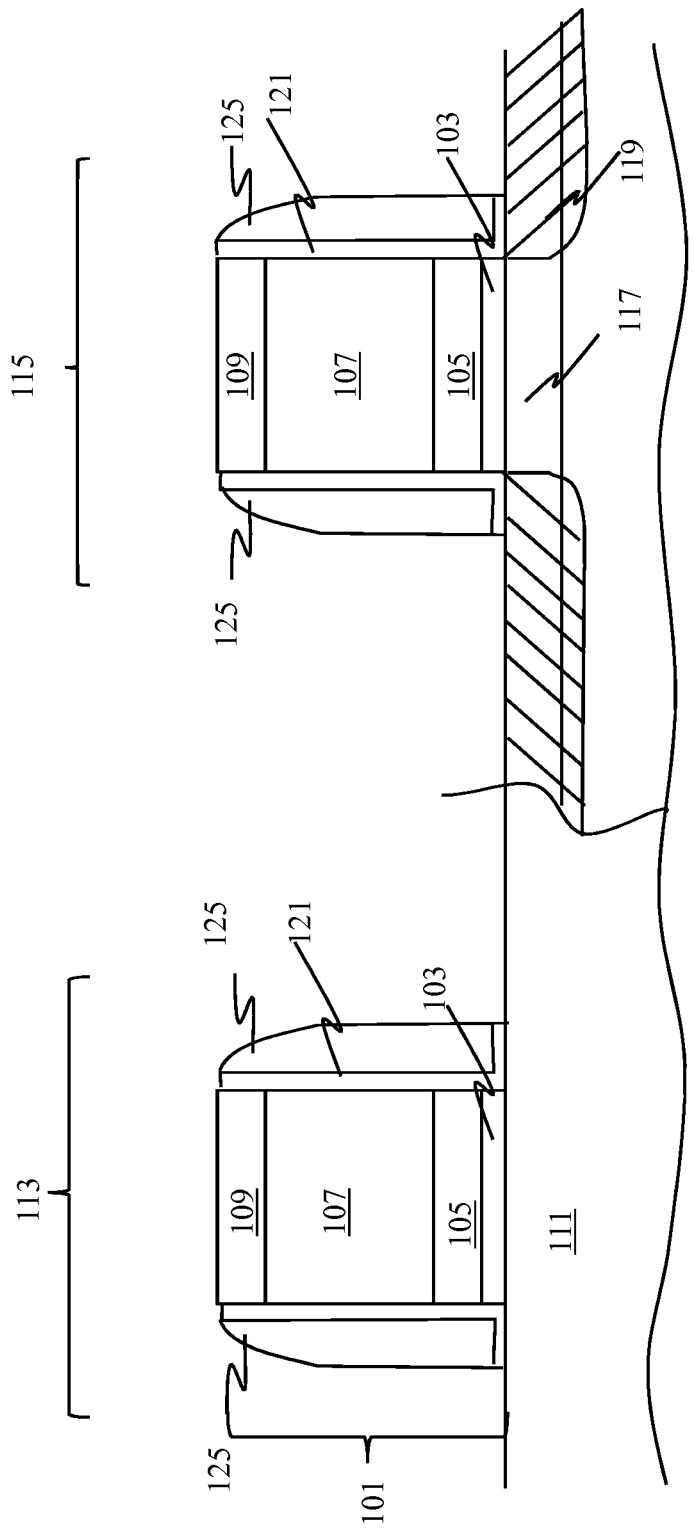

As illustrated in FIG. 1B, oxide layer 123 is anisotropically etched to form $SiO_2$ spacers 125. MLD $Si_3N_4$ layer 119 is also etched from the open active areas. The spacers are used to offset and adjust halo/extension implants for the NMOS and halo implants for the PMOS, illustrated in FIG. 1C, using an implant mask for each. Halo regions are formed by implanting a low to medium dose (e.g., 3.5 E13 to 7 E13) of arsenic (As), boron (B), or boron fluoride ($BF_2$) at a medium energy (for example 35 keV to 50 keV). Extension regions are formed by implanting a high dose (e.g. 1.1 E15) of AS, B, or $BF_2$ at a low energy (for example 0.7 keV for B or 4 keV for As).

Figure 1C:
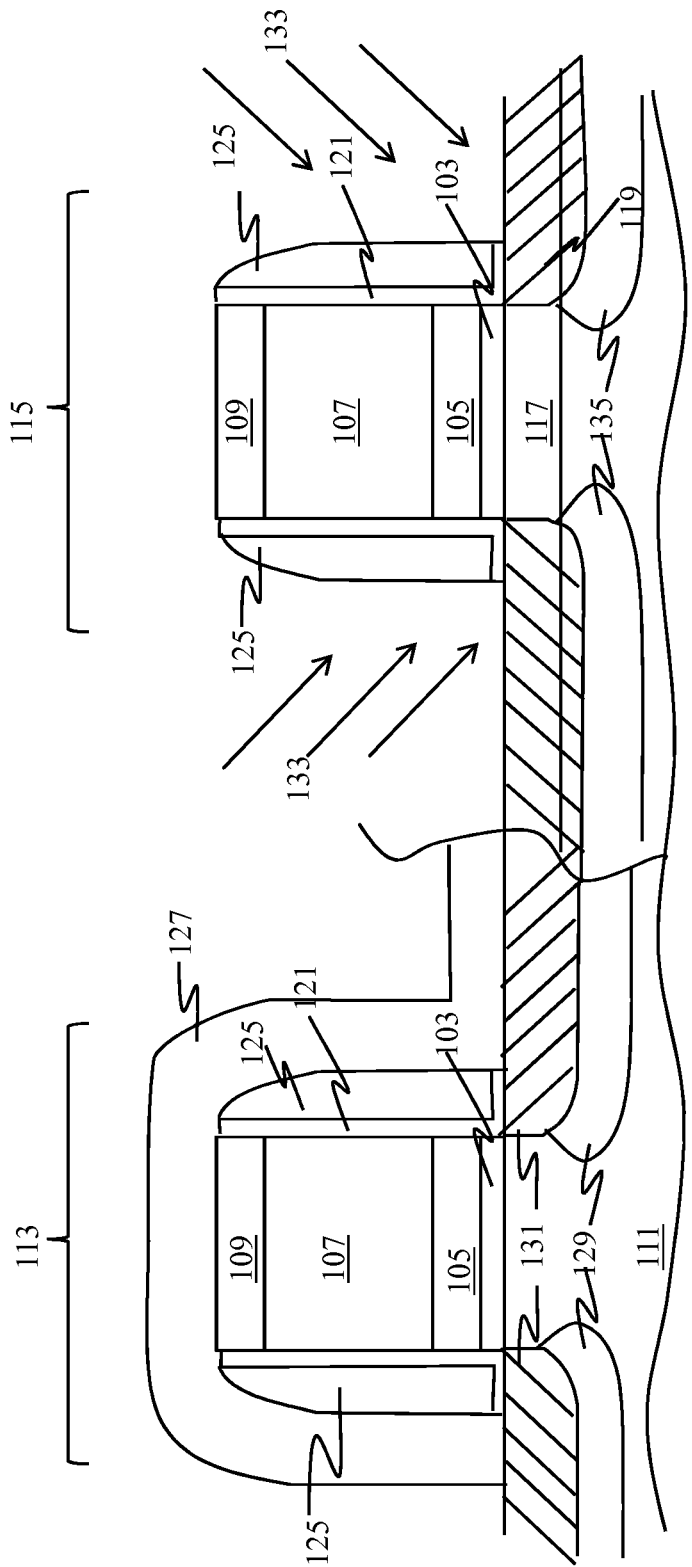

Next, a hardmask 127 is deposited over the whole substrate and then removed over the PMOS 115, as illustrated in FIG. 3C. Hardmask 127 may be formed of SiN to a thickness of 45 nm to 80 nm. Halo 129 and extension 131 implants for the NMOS may be performed prior to deposition of hardmask 127 (as illustrated in FIG. 1C) by use of a resist to cover the PMOS or later, post hardmask removal. A halo implant that is needed for short channel control of the devices is employed. After the hardmask is formed, PMOS halo implantation 133 is performed to form halo regions 135. Alternatively, the PMOS halo implantation may be done after the PMOS source/drain cavities are etched.

Figure 1D:
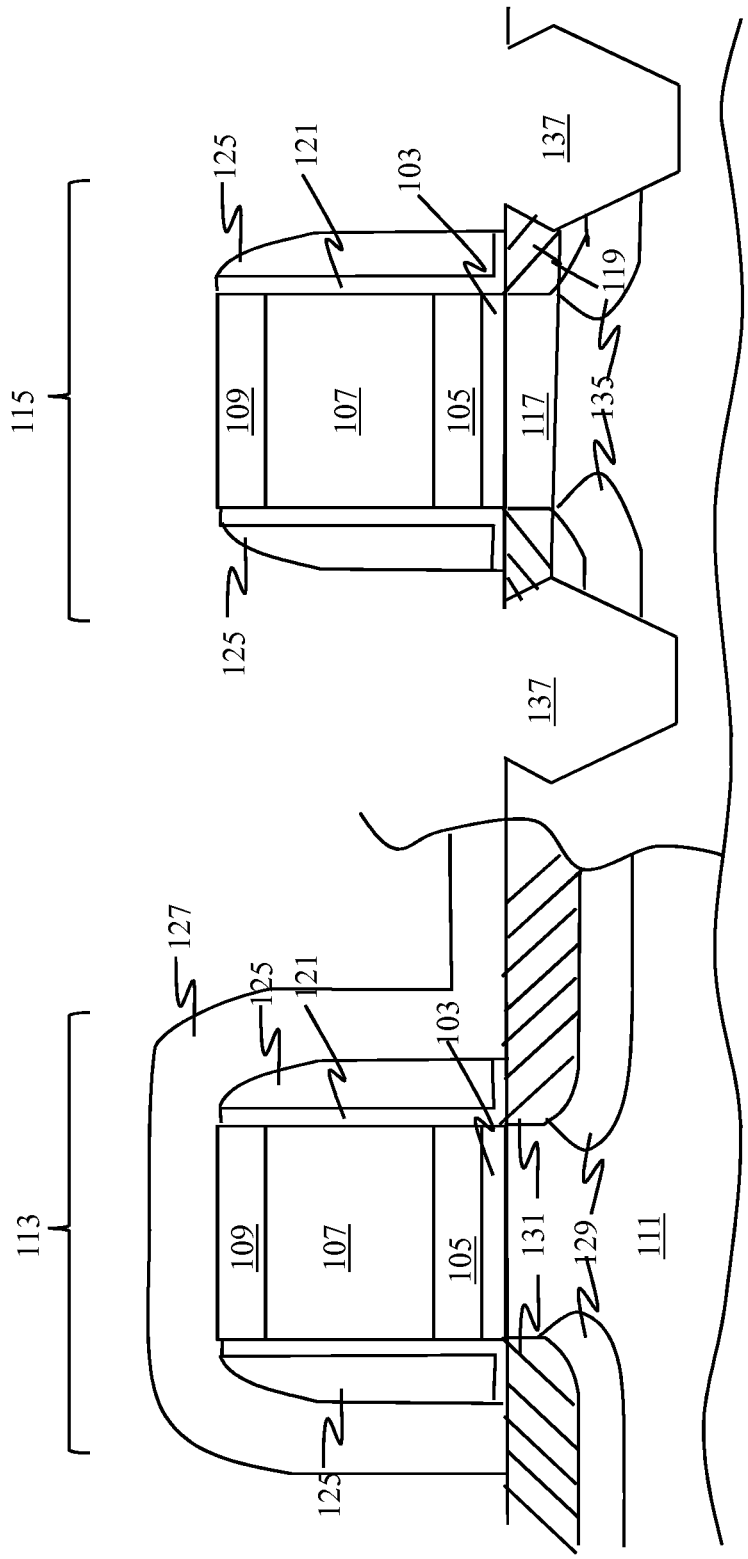

Adverting to FIG. 1D, a sigma shaped cavity 137 is formed using TMAH in the substrate on each side of the PMOS 115 gate stack. Although other shapes are possible, the sigma shaped cavity allows very close proximities and therefore maximum stress inside the transistor channel region. Before further processing, a preclean is performed that is optimized (i.e., not very aggressive) to protect the $SiO_2$ cap and spacer from being partially removed and to protect the polysilicon gate against defectivity growth.

Figure 1E:
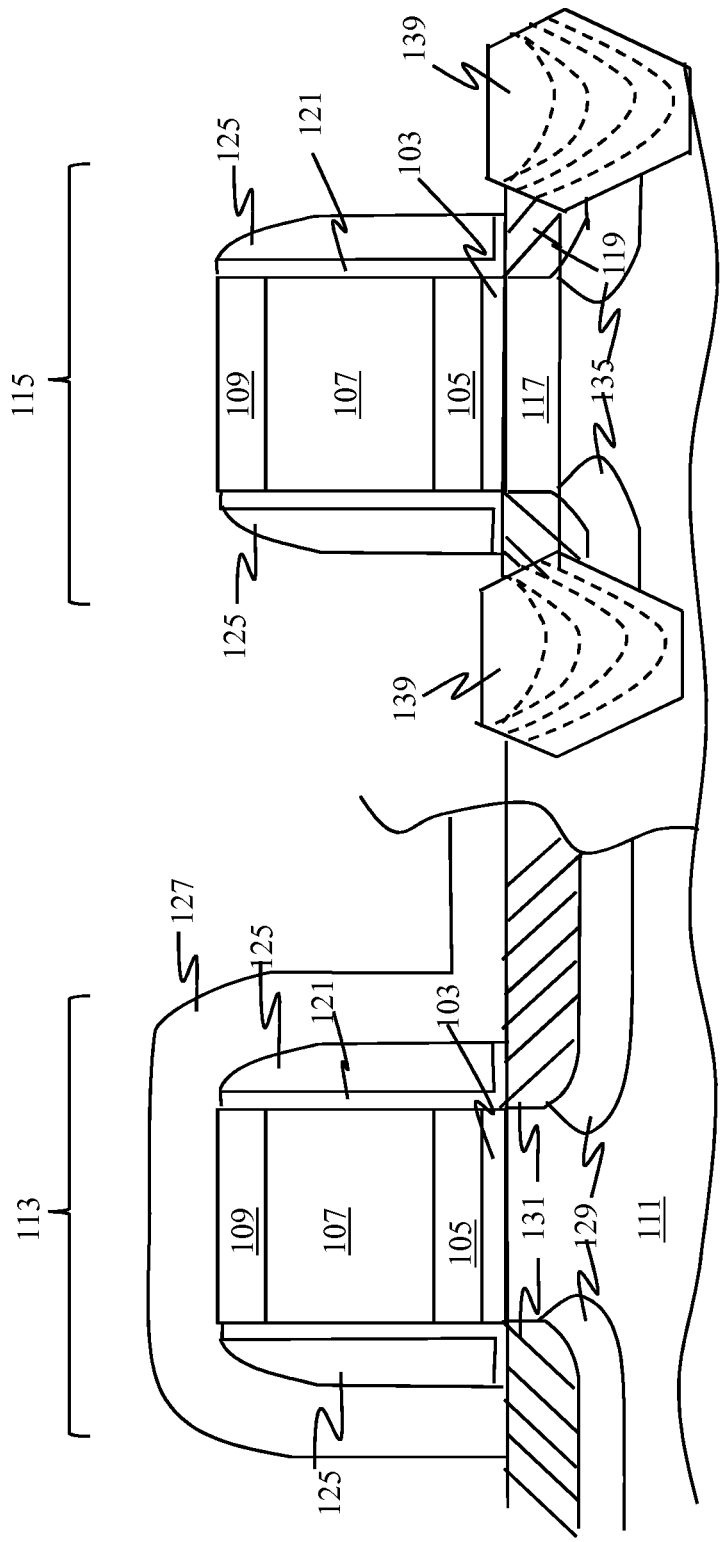

After the preclean, as illustrated in FIG. 1E, SiGe 139 is grown in the cavities 137, for example by a low-pressure chemical vapor deposition (LPCVD) process as an in-situ graded boron doped deposition for the deep source/drain areas of the PMOS device. In-situ doping is employed to allow high and uniform doping levels, which in turn reduces parasitic resistance and contact resistance, thereby allowing higher drive currents. In addition, the boron allow the germanium content to be increased, e.g. to greater than 35%, as opposed to 25% for undoped SiGe, which induces higher stresses and further improves hole mobility enhancement. Also, by doping the source/drain regions of the PMOS during the epitaxy, a dedicated source/drain implantation is eliminated, thereby saving process costs for masks and implantation, reducing cycle time, and reducing stress relaxation from implant damage. Further, the boron dopants are activated by the epitaxy, thereby eliminating the need for an additional anneal. A slight overgrowth helps to form a more solid encapsulation and margin for subsequent cleans that attack the active open silicon area. The overgrowth further provides extra margin for forming a solid salicide, for example nickel silicide (NiSi), and has better contact resistance.

Figure 1F:
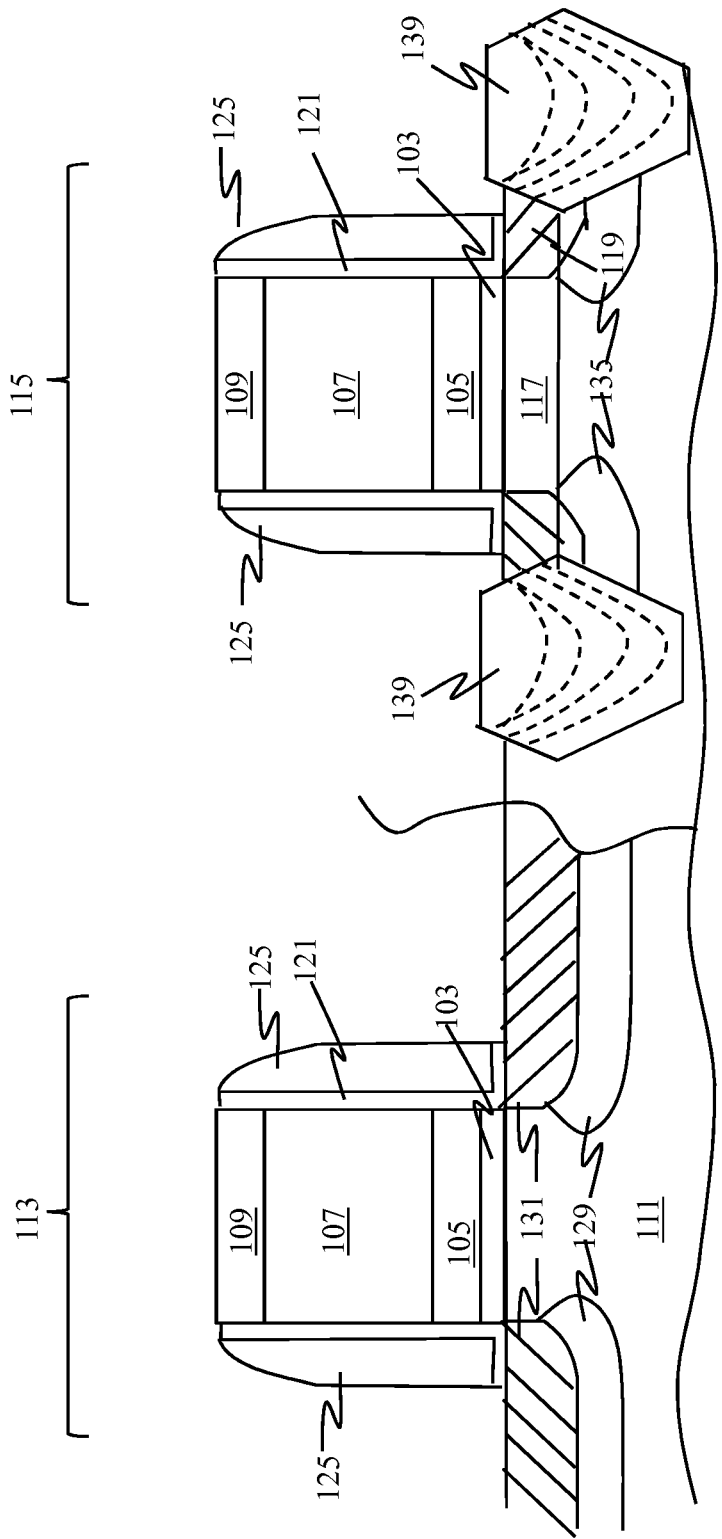

As illustrated in FIG. 1F, another cleaning step, e.g. with phosphoric acid ($H_3PO_4$), or a dry etch will remove SiN hardmask 127 from NMOS 113. As previously disclosed, if implantations for the halo and extension areas 129 and 131, respectively, for NMOS 113 have not been previously performed, the halo and extension regions may be performed once the SiN hardmask 127 is removed.

Figure 1G:
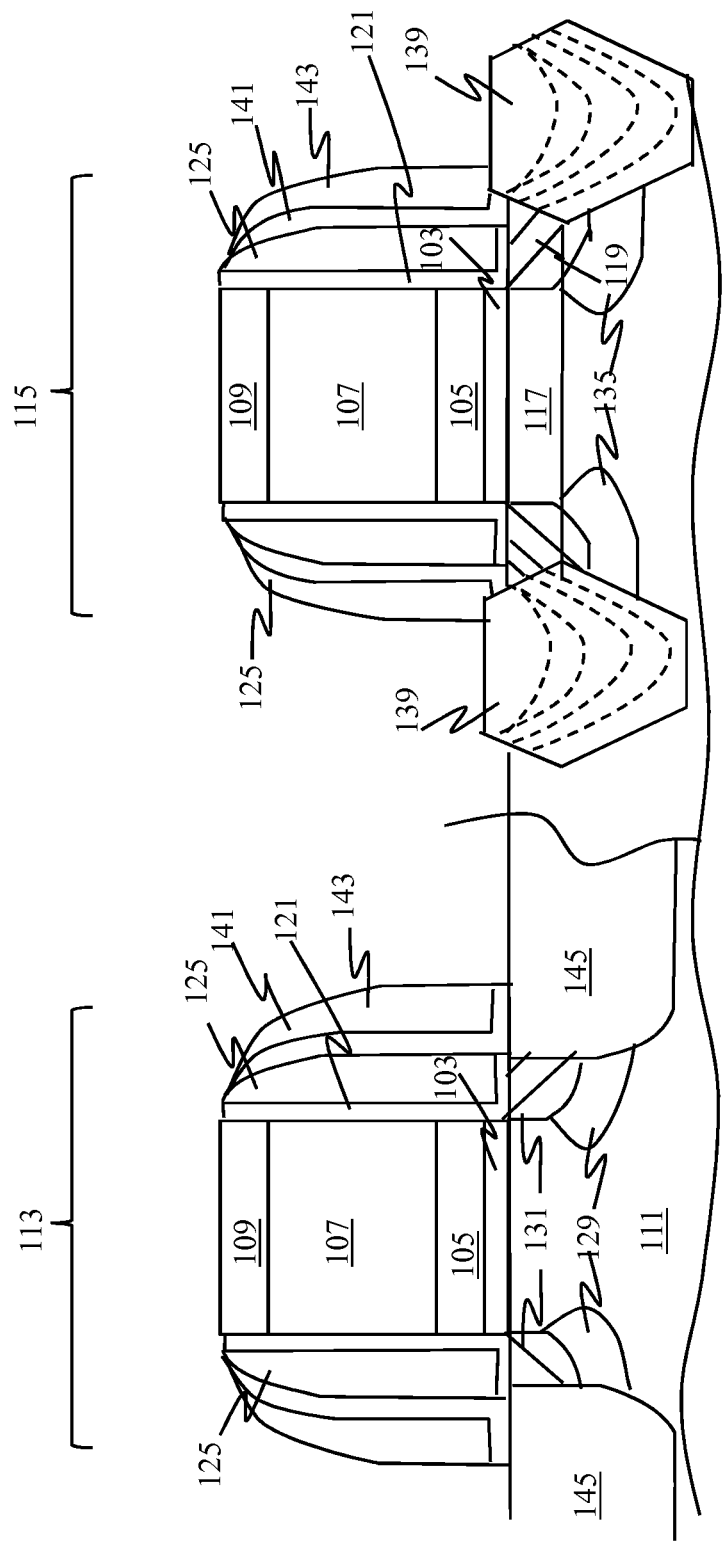

Adverting to FIG. 1G, a conformal liner 141 and SiN layer are sequentially deposited, and conformal spacers 143 are etched from the SiN layer on both PMOS 115 and NMOS 113. The conformal liner may, for example be formed of $SiO_2$ to a thickness of 15 nm to 22 nm. Spacers 143 are formed to a thickness of 15 nm to 22 nm. Conformal spacers 143 are required for source/drain implantations for the NMOS to form source/drain regions 145, and for a subsequent salicidation process. Implantation of source/drain regions 145 is followed by a high temperature and/or laser annealing process to freeze and activate all of the implanted dopants and allow them to diffuse. Oxide cap 109 on poly-Si 107 for each of NMOS 113 and PMOS 115 prevents a through implantation into the channel region from the deep source/drain implant. For forming deep source/drain regions, As, B, or $BF_2$ may, for example, be implanted at a high dose (e.g., 2 E15) and high energy (e.g., 6 keV for B or 20 keV for As).

Figure 1H:
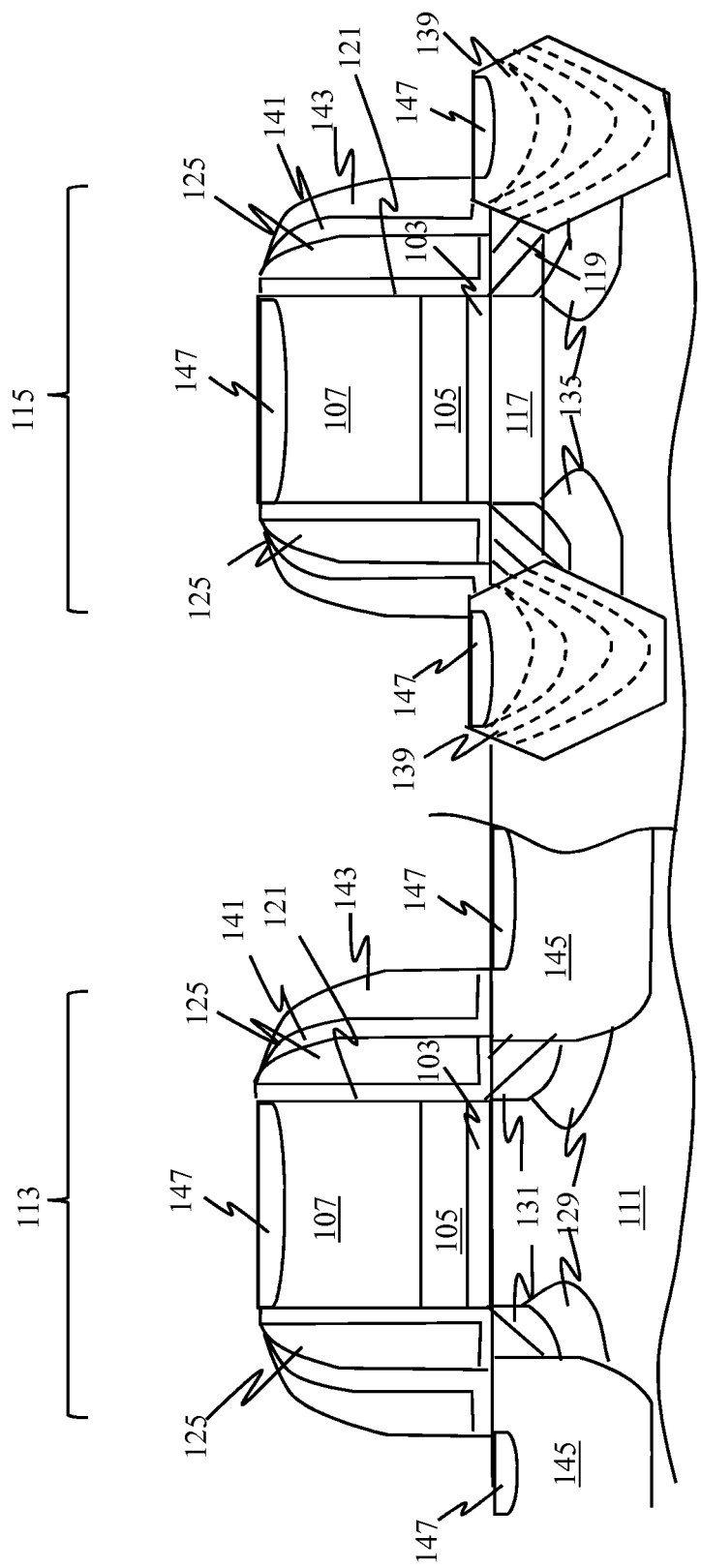

As illustrated in FIG. 1H, once all implantations are complete, a pre-clean including hydrogen fluoride (HF) removes the residual $SiO_2$ cap from the poly-Si gates 107 and cleans the surface for salicidation. Metal, for example nickel (Ni), nickel titanium (NiTi), or cobalt (Co), may then be deposited over the entire device and annealed to form a silicide 147 over source/drain regions 145 and poly-Si 107 (i.e., NiSi, NiTiSi, or CoSi) and over SiGe 139 (i.e., NiSiGe, NiTiSiGe, or CoSiGe), to form low resistance areas. The silicide combined with the SiGe lowers the sheet and contact resistance, thereby improving performance behavior. The process flow then continues with conventional middle-of-line (MOL) processes and contact formation.

The embodiments of the present disclosure can achieve several technical effects, including improved gate first HKMG encapsulation, thereby improving yield, lower contact resistance, lower serial resistance in the PMOS devices, increased carrier mobility and drive current with lower power in the PMOS devices, increased performance, and lower manufacturing costs. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 32 nm and 28 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   first and second high-k dielectric metal gate (HKMG) stacks, each comprising a high-k dielectric, a work function metal, and polysilicon (poly-Si);
   a nitride liner, oxide spacers, a conformal liner, and nitride spacers successively formed on each side of each of the first and second HKMG gate stacks;
   extension regions at opposite sides of the first HKMG gate stack formed prior to the nitride liner;
   embedded silicon germanium (eSiGe) at opposite sides of the first HKMG gate stack, formed prior to the conformal liner using a hardmask over the second gate stack; and
   deep source/drain regions at opposite sides of the second gate HKMG gate stack formed using the nitride spacers as a soft mask.

2. The device according to claim 1 wherein the nitride liner and nitride spacers comprise silicon nitride (SiN).

3. The device according to claim 1 wherein the oxide spacers comprise silicon dioxide (SiO2).

4. The device according to claim 1, wherein the eSiGe is doped in-situ with boron.

5. The device according to claim 4, wherein the eSiGe has a graded doping profile.

6. The device according to claim 4, wherein the eSiGe has a germanium content greater than 35%.

7. The device according to claim 1, further comprising:
   halo regions at opposite sides of the first HKMG stack, formed directly prior to the eSiGe; and
   halo and extension regions at opposite sides of the second HKMG stack formed directly after the oxide spacers.

8. The device according to claim 1, further comprising a silicide on the eSiGe, the deep source/drain regions, and the first and second HKMG stacks.

9. The device according to claim 1, further comprising a channel SiGe region below the first HKMG stack.

10. A device comprising:
PMOS and NMOS high-k dielectric metal gate (HKMG) stacks, each comprising a high-k dielectric, a work function metal, and polysilicon (poly-Si);
an L-shaped nitride liner, oxide spacers, a conformal liner, and nitride spacers successively formed on each side of each of the PMOS and NMOS HKMG stacks;
extension regions at opposite sides of the PMOS HKMG stack formed prior to the nitride liner;
embedded silicon germanium (eSiGe) at opposite sides of the PMOS HKMG stack, formed prior to the conformal liner using a hardmask over the NMOS HKMG stack; and
deep source/drain regions at opposite sides of the NMOS HKMG gate stack formed using the nitride spacers as a soft mask.

11. The device according to claim 10 wherein the L-shaped nitride liner and nitride spacers comprise silicon nitride (SiN).

12. The device according to claim 10 wherein the oxide spacers comprise silicon dioxide (SiO2).

13. The device according to claim 10, wherein the eSiGe is doped in-situ with boron.

14. The device according to claim 13, wherein the eSiGe has a graded doping profile.

15. The device according to claim 13, wherein the eSiGe has a germanium content greater than 35%.

16. The device according to claim 10, further comprising:
halo regions at opposite sides of the PMOS HKMG stack, formed directly prior to the eSiGe; and
halo and extension regions at opposite sides of the NMOS HKMG stack formed directly after the oxide spacers.

17. The device according to claim 10, further comprising a silicide on the eSiGe, the deep source/drain regions, and the PMOS and NMOS HKMG stacks.

18. The device according to claim 10, further comprising a channel SiGe region below the PMOS HKMG stack.

19. A device comprising:
PMOS and NMOS high-k dielectric metal gate (HKMG) stacks, each comprising a high-k dielectric, a work function metal, and polysilicon (poly-Si);
an L-shaped silicon nitride (SiN) liner, silicon dioxide (SiO2) spacers, a conformal liner, and SiN spacers successively formed on each side of each of the PMOS and NMOS HKMG stacks, wherein the L-shaped nitride liner has a thickness of 3 nanometers (nm) to 6 nm, and the SiO2 spacers have a width of 6 nm to 11 nm;
extension regions at opposite sides of the PMOS HKMG stack formed prior to the nitride liner;
embedded silicon germanium (eSiGe), in-situ doped with boron and having a graded doping profile and a germanium content greater than 35%, formed in a sigma shaped cavity at opposite sides of the PMOS HKMG stack prior to the conformal liner using a hardmask over the second gate stack;
deep source/drain regions at opposite sides of the NMOS HKMG stack formed using the nitride spacers as a soft mask; and
a silicide on the eSiGe, the deep source/drain regions, and the PMOS and NMOS HKMG stacks.

20. The device according to claim 19, further comprising a channel SiGe region below the PMOS HKMG stack.

* * * * *